(12) United States Patent
Tam et al.

(10) Patent No.: US 6,396,855 B1
(45) Date of Patent: May 28, 2002

(54) FIBRE GRATINGS

(75) Inventors: Hwa Yaw Tam; Wai Sing Man, both of Kowloon (HK)

(73) Assignee: The Hong Kong Polytechnic University, Kowloon (HK)

( * ) Notice: Subject to any disclaimer, the term of this patent is extended or adjusted under 35 U.S.C. 154(b) by 0 days.

(21) Appl. No.: 09/679,539

(22) Filed: Oct. 6, 2000

(51) Int. Cl.⁷ .................................................. H01S 3/10
(52) U.S. Cl. ................. 372/20; 372/6; 385/37
(58) Field of Search .............................. 372/20, 6, 6 A; 385/37

(56) References Cited

U.S. PATENT DOCUMENTS 6,181,851 B1 * 1/2001 Pan et al. ..................... 385/37
6,229,827 B1 * 5/2001 Fernald et al. ................ 372/20
2001/0051019 A1 * 12/2001 Bailey et al. .................. 385/37

* cited by examiner

Primary Examiner—Leon Scott, Jr.
(74) Attorney, Agent, or Firm—Leydig, Voit & Mayer, Ltd.

(57) ABSTRACT

A tunable laser has a fibre Bragg grating anchored at each to relatively movable fixtures and an actuator coupled to the fixtures for creating relative movement that longitudinally stretches or compresses the fibre Bragg grating. Measuring means are arranged to directly monitor a longitudinal separation between the fixtures and a microprocessor that is programmed to respond to signals from the measuring means controls the actuator to change the separation between the fixtures to tune the laser to a desired wavelength.

6 Claims, 4 Drawing Sheets

FIBRE GRATINGS

BACKGROUND OF THE INVENTION

1. Field of the Invention

The invention relates fibre gratings.

2. Description of Prior Art

The invention relates more particularly to tunable fibre lasers based on grating techniques which have applications for dense wavelength division multiplexing communication (DWDM) systems. A tunable fibre laser has a high pumping efficiency, is easy to fabricate and has a wide tuning range. However, difficulty of wavelength tuning accuracy and repeatability remain problems and are required for stringent requirements in lightwave communications, especially in DWDM systems.

Wavelength tuning of Bragg grating fibre lasers is easily achieved either thermally or mechanically. Direct thermal tuning however provides only a limited tuning range because of the low wavelength temperature coefficient and is difficult to control. Mechanical stretching or compressing is based presently on either piezoelectric transducers or stepping motors that inherently introduce non-linearity so tuning normally, and repeatability, are difficult to achieve.

SUMMARY OF THE INVENTION

It is an object of the invention to overcome at least reduce these problems.

According to the invention there is provided a tunable laser having a fibre Bragg grating anchored at each to relatively movable fixtures, an actuator coupled to the fixtures for creating relative movement that longitudinally stretches or compresses the fibre Bragg grating, measuring means arranged to directly monitor a longitudinal separation between the fixtures, and a microprocessor programmed to respond to signals from the measuring means and to control the actuator to change the separation between the fixtures to tune the laser to a desired wavelength.

The measurable means may be a linear variable differential transformer.

The measuring means may be a differential variable reluctance transformer.

A core of the transformer may be attached to one of the fixtures and a pick-up coil of the transformer attached to the other of the fixtures.

The measuring means may be an optical displacement sensor comprising twin optical fibres attached to one of the fixtures and a reflecting mirror attached to the other of the fixtures, the separation being monitored by a coupling loss between ends of the fibres and light reflected by the mirror

BRIEF DESCRIPTION OF THE DRAWINGS

Tunable fibre Bragg grating lasers according to the invention will now be described by way of example with reference to the accompanying schematic drawings in which.

DESCRIPTION OF THE PREFERRED EMBODIMENT

Figure 1:
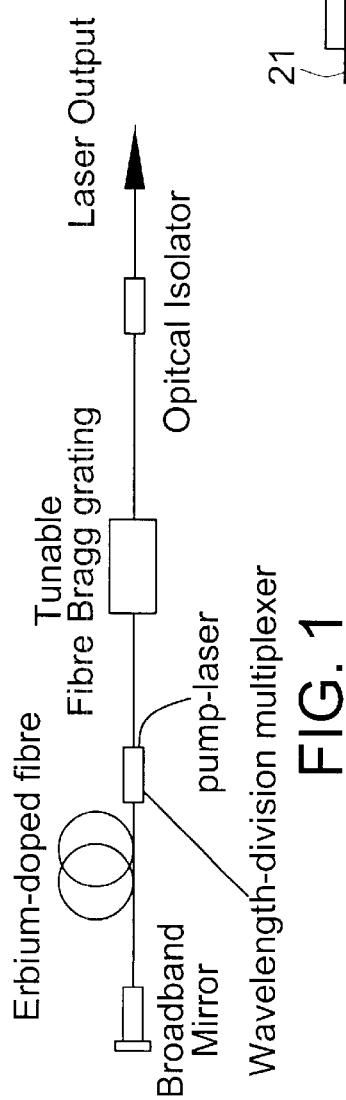
FIG. 1 is a typical wavelength tuned laser.

Referring to the drawings, in FIG. 1 a fibre grating laser consists of a piece of erbium-doped fibre (EDF) sandwiched between two reflectors, M and FBG. The EDF provides optical gain when it is pumped with a laser diode of appropriate wavelength. M is a high-reflection broadband mirror that reflects all wavelengths generated by the EDF. FBG is a fibre Bragg grating that partially reflects (typically around 60%) a narrow band of wavelengths centred at the Bragg wavelengths, $\lambda_B$. When the laser is pumped, it will emit an intense light of wavelength $\lambda_B$. However, $\lambda_B$ can be changed by stretching or compressing the FBG to alter its Bragg wavelength. The wavelength-division multiplexer allows light from the pump laser to reach the EDF as well as permits light generated by the EDF to reach the tunable fibre Bragg grating. The optical isolator is to prevents any unwanted light from entering fibre laser.

Figure 2:
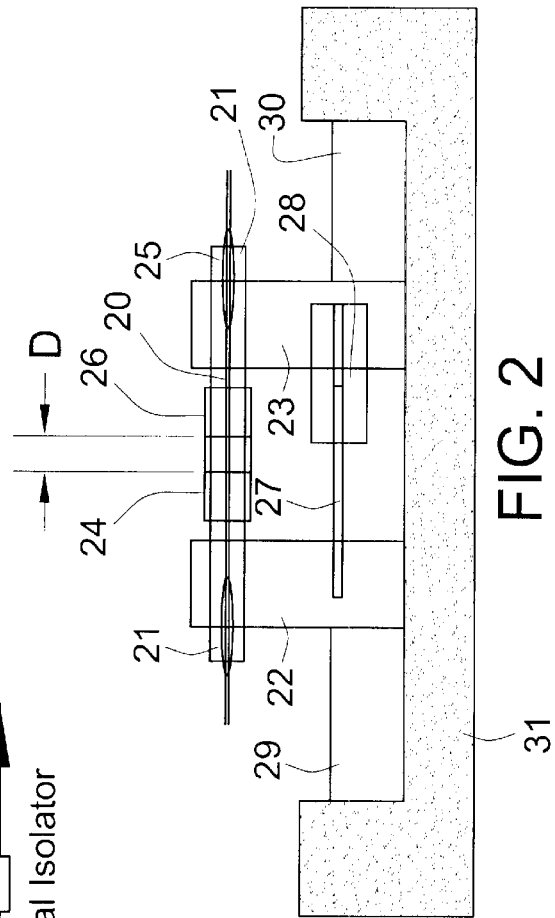
FIG. 2 is a configuration of one tunable Bragg fibre grating.

In FIG. 2, a fibre Bragg grating 20 is anchored by epoxy resin 21 to upright fixtures 22 and 23 at each end. The grating 20 is supported in capilliary tubes 24 and 25, having an inner diameter slightly greater than the diameter of the fibre grating. The capilliary tubes are bridged together by an alignment sleeve 26. The capillary tubes 24 and 25 are glued to the fixtures 22 and 23. A separation D is small so that the fibre will not buckle when it is compressed. A linear variable differential transformer or a differential variable reluctane transformer is used to monitor the longitudinal separation between the fixtures 22 and 23. Both devices are known per se and commercially available as linear displacement measuring devices.

A core 26 of the transformer is attached to the fixture 22 and a pick-up coil 17 of the transformer is attached to the fixture 23. Electric actuators 28 and 29 are attached respectively to the fixtures 22 and 23, and to a base platform 30. In use, when a voltage is applied to the actuators 29 and 30, the fixtures 22 and 23 are moved towards each other to compress the fibre Bragg grating 20. The movement, or change in separation between the fixtures, is detected by the equal relative movement of the core 26 with respect to the pick-up coil 27.

In a typical arrangement for the described embodiment, fractional change in laser wavelength is given by the equation:

$$\frac{\Delta\lambda_L}{\lambda_L} = C(1 - P_e)x$$

Where $P_e$ is the photoelastic constant, x is the position of the core 26 and C is a constant that depends on the sensitivity of the transformer and the grating and compression lengths of the fibre. The core position is derived from an output voltage of the transformer.

Thus in order to tune the laser, voltages are applied to the electrical actuators until the desired output voltage of the transformer is achieved. As such, the tuning of the laser is deduced independent of inherent non-linear characteristics of the electrical actuators and the setting of the required compression for desired tuning is readily repeatable.

Figure 3:
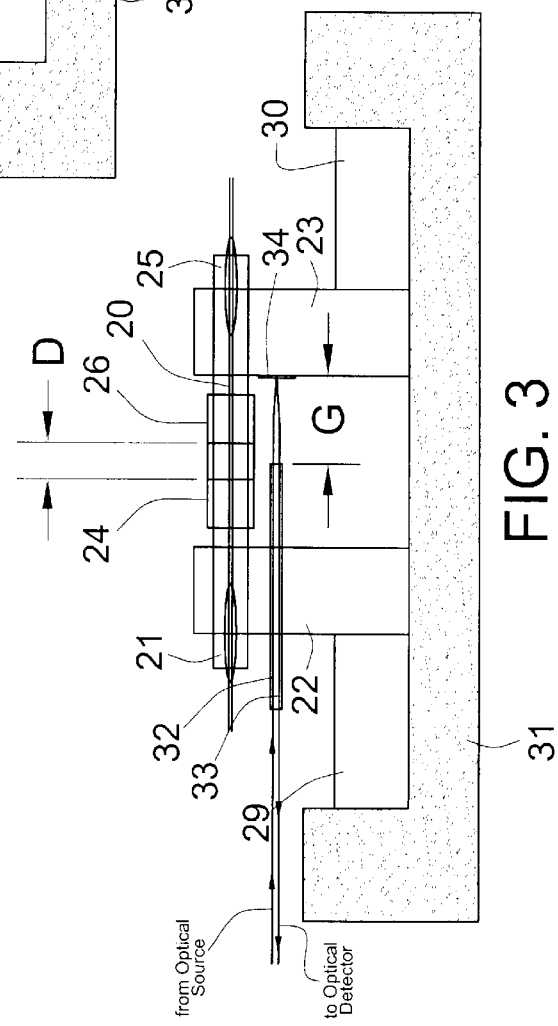
FIG. 3 is a configuration of another tunable fibre Bragg grating.

In FIG. 3, the tunable fibre Bragg grating is the same as shown in FIG. 2. In FIG. 3, the compression is applied to the grating to change 'D' and this is measured optically by changes in 'G' using twin optical fibres 31 and 32 or a bundle of optical fibres attached to the fixture 22 and a mirror 33 mounted on the fixture 23. As the separation between the fixtures changes, the optical coupling between the fibres 31 and 32 changes and such changes represent increments of change of separation of the fixtures. In principle and in the same way as before, this direct separation measurement is used to alter or monitor the effect of the application of the electric actuators 29 and 30 on the fixtures 22 and 23. As before, the grating compression is accurately controllable and repeatable as required.

Figure 5:
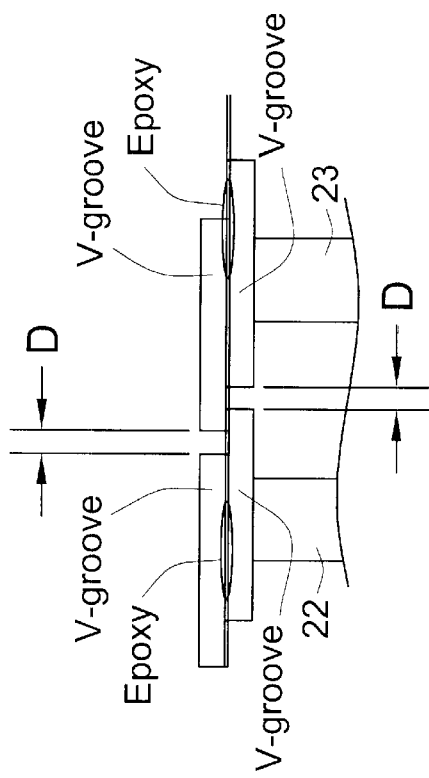
FIG. 5 is another physical configuration of the fibre Bragg grating attached to the fixtures.
Figure 6:
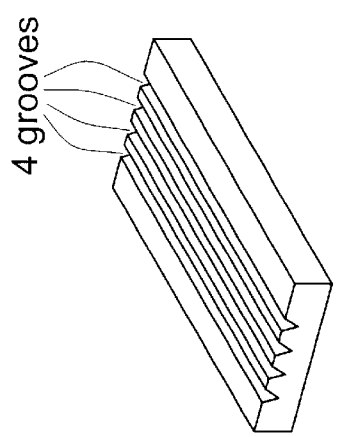
FIG. 6 shows a typical grooved block used to support the fibre Bragg gratings.
Figure 4:
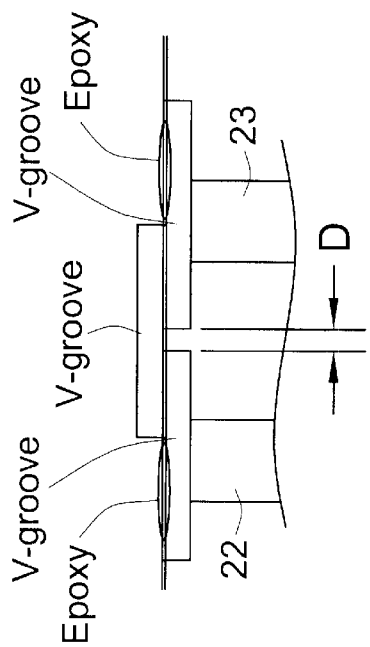
FIG. 4 is a physical configuration of the fibre Bragg grating attached to fixtures a each end.
Figure 7:
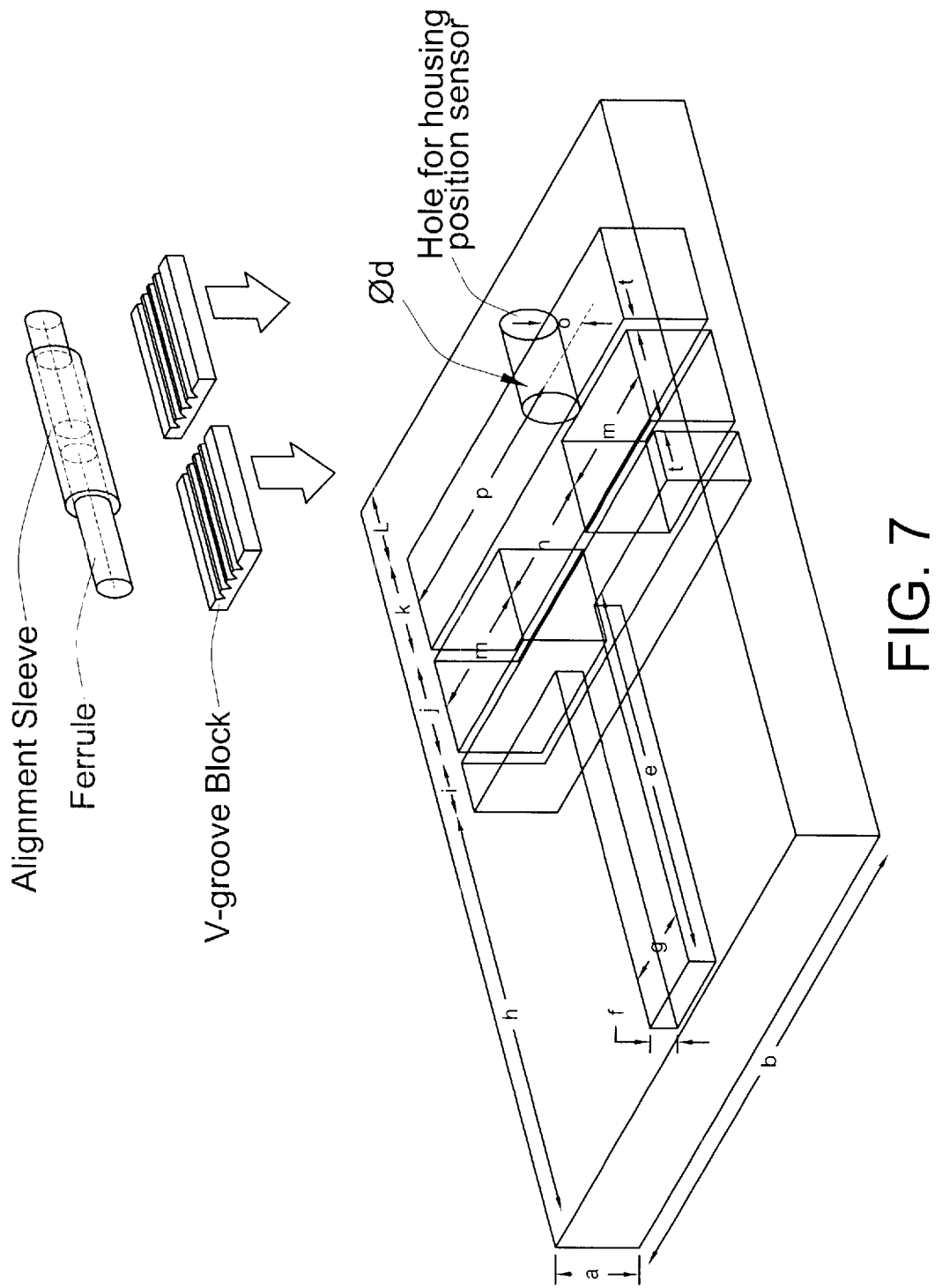
FIG. 7 shows composite container for used for supporting components of the tunable laser.

FIGS. 4 and 5 show different physically configurations for supporting and fixing the fibre Bragg gratings to the fixtures 22 and 23. V-grooved blocks that are shown in FIG. 6 are used below and above the fibres instead of using the capillary tubes 24 and 25. It is also illustrated in FIG. 5 how the exposed section of grating can be monitored for the amount of compression, as required, by directly measuring D' with a transformer device or an optical displacement device, as described with reference to FIGS. 1 and 2.

FIG. 6 shows a V-groove block with four grooves. V-groove is a "V" shaped groove etched in a silicon chip that can accurately position a fibre. V-groove blocks with different numbers of V-grooves are commercially available.

Figure 8:
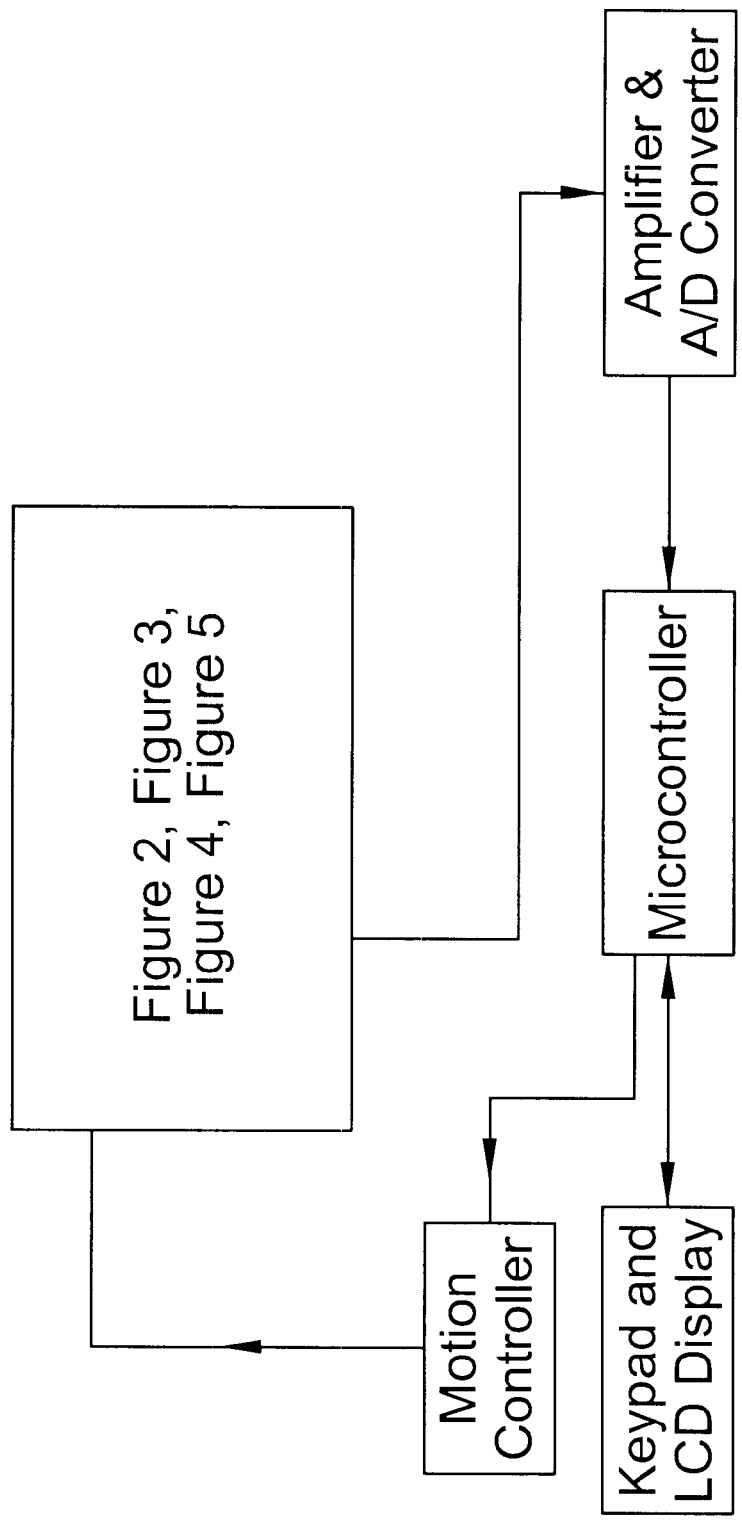
FIG. 8 is a schematic layout of an automatic control system for the tunable laser.

The schematic circuit shown in FIG. 8, includes a microprocessor that controls voltages supplied to the electrical actuators and responds to the output voltage of the transformer so as to adjust or set the compression in the gratings for tuning the laser as required. The keypad allows a user to enter the WAVELENGTH that he/she wishes the laser to emit or the START WAVELENGTH and STOP WAVELENGTH that he/she wishes the laser to scan.

We claim:

1. A tunable laser having:

a fibre Bragg grating anchored at first and second ends to relatively movable first and second fixtures, respectively, an actuator coupled to the first and second fixtures for creating relative movement that longitudinally stretches and compresses the fibre Bragg grating, measuring means arranged to directly monitor longitudinal separation between the first and second fixtures, and a microprocessor programmed to respond to signals from the measuring means and to control the actuator to change the longitudinal separation between the fixtures to tune the tunable laser to produce light at a desired wavelength.

2. The tunable laser according to claim 1, wherein the measuring means is a linear variable differential transformer.

3. The tunable laser according to claim 1, wherein the measuring means is a differential variable reluctance transformer.

4. The tunable laser according to claim 2, wherein a core of the transformer is attached to the first fixture and a pick-up coil of the transformer is attached to the second fixture.

5. The tunable laser according to claim 1, wherein the measuring means is an optical displacement sensor comprising twin optical fibres attached to the first fixture and a reflecting mirror attached to the second fixture, the longitudinal separation being monitored by coupling loss between the first and second ends of the fibres and light reflected by the mirror.

6. The tunable laser according to claim 3, wherein a core of the transformer is attached to the first fixture and a pick-up coil of the transformer is attached to the second fixture.

* * * * *